United States Patent
Ko et al.

(10) Patent No.: US 9,292,025 B2
(45) Date of Patent: *Mar. 22, 2016

(54) PERFORMANCE, THERMAL AND POWER MANAGEMENT SYSTEM ASSOCIATED WITH AN INTEGRATED CIRCUIT AND RELATED METHOD

(71) Applicant: MediaTek Singapore Pte. Ltd., Singapore (SG)

(72) Inventors: Uming Ko, Houston, TX (US); Gordon Gammie, Plano, TX (US); Alice Wang, Allen, TX (US)

(73) Assignee: MediaTek Singapore Pte. Ltd., Singapore (SG)

(*) Notice: Subject to any disclaimer, the term of this patent is extended or adjusted under 35 U.S.C. 154(b) by 424 days.

This patent is subject to a terminal disclaimer.

(21) Appl. No.: 13/719,193

(22) Filed: Dec. 18, 2012

(65) Prior Publication Data

US 2013/0154723 A1 Jun. 20, 2013

Related U.S. Application Data

(60) Provisional application No. 61/577,304, filed on Dec. 19, 2011.

(51) Int. Cl.
| G05F 1/46 | (2006.01) |
| G01R 31/317 | (2006.01) |
| G01R 31/28 | (2006.01) |
| G06F 1/20 | (2006.01) |
| G06F 1/26 | (2006.01) |

(52) U.S. Cl.
CPC ............ *G05F 1/462* (2013.01); *G01R 31/2834* (2013.01); *G01R 31/31721* (2013.01); *G01R 31/31724* (2013.01); *G05F 1/46* (2013.01); *G06F 1/206* (2013.01); *G06F 1/26* (2013.01)

(58) Field of Classification Search
CPC ............ G05F 1/46; G05F 1/462; G06F 1/26; G06F 1/206
See application file for complete search history.

(56) References Cited

U.S. PATENT DOCUMENTS

| 6,535,735 | B2 | 3/2003 | Underbrink |
| 7,075,276 | B2 | 7/2006 | Morales |
| 7,498,870 | B2 | 3/2009 | Mair |
| 7,581,122 | B2 | 8/2009 | Kim |
| 7,793,119 | B2 | 9/2010 | Gammie |
| 2007/0096775 | A1 | 5/2007 | Elgebaly |
| 2008/0155282 | A1* | 6/2008 | Gammie et al. ............ 713/300 |
| 2009/0077402 | A1 | 3/2009 | Huang |
| 2009/0158073 | A1 | 6/2009 | Hsieh |
| 2010/0225630 | A1 | 9/2010 | Levey |
| 2012/0075005 | A1* | 3/2012 | Flores et al. .............. 327/512 |

FOREIGN PATENT DOCUMENTS

| CN | 1728021 A | 2/2006 |
| CN | 102156498 A | 8/2011 |

* cited by examiner

*Primary Examiner* — Kim Huynh
*Assistant Examiner* — Vincent Chang
(74) *Attorney, Agent, or Firm* — Winston Hsu; Scott Margo

(57) ABSTRACT

The performance, thermal and power management system is configured to perform DVFS calibration, temperature compensation adjustment, aging calibration, and DC offset calibration in an IC. The initial voltage supplied to the IC may be set to an initial value which takes chip-to-chip process variations into account and then dynamically adjusted according to temperature variations, DC offset and/or aging effects. Therefore, the performance, thermal and power management system may achieve optimized thermal and power performance of the IC.

22 Claims, 6 Drawing Sheets

PERFORMANCE, THERMAL AND POWER MANAGEMENT SYSTEM ASSOCIATED WITH AN INTEGRATED CIRCUIT AND RELATED METHOD

CROSS REFERENCE TO RELATED APPLICATIONS

This application claims the benefit of U.S. provisional application 61/577,304, filed on Dec. 19, 2011, which is incorporated by reference in its entirety.

BACKGROUND

Advances in semiconductor manufacturing technology have resulted in ever decreasing physical dimensions for the various circuit elements, such as, for example, field effect transistors, which are used in forming integrated circuits (ICs). Many ICs in a given electronic device have different functions and can operate at different frequencies. Typically, all ICs and/or all parts of a given IC may receive a voltage potential that is substantially uniform. However, as the market for consumer electronics is constantly improving, there is an increasing demand for smaller circuit packages that operate at increased speeds and consume less power for the purpose of conserving battery-life, such as in wireless communication applications. As such, one method of conserving power is to operate different ICs, or even different portions of a single IC, with a voltage that is optimized for an application use. Accordingly, power is conserved in the electronic device by not applying more than sufficient power for a given one or more of the ICs, according to the application use.

The voltage applied to a given IC for a given application use may be determined during production testing. However, environmental changes and process variations may change operating characteristics for the given IC, even subsequent to production testing of the given IC. For example, the frequency of the given IC for the given operation may vary with changes in temperature. Meanwhile, differences in transistor strength and performance variations may dictate different characteristic values that affect the operating frequency from one IC to another for the given application use.

In addition, through switching of semiconductor devices, the semiconductor material from which the semiconductor devices are made ages. As the semiconductor material of the IC ages, the transistors formed therein may be subject to deleterious effects. For example, PMOS transistors may be subject to negative biased temperature instability (NBTI), such that larger DC gate-to-source voltages are required for activation of the PMOS transistors. As another example, NMOS transistors may be subject to channel hot carrier (CHC) effects, such that the NMOS transistors can be affected with higher slew, resulting in slower switching transitions at constant bias voltages. Due to the aging effect, higher voltage levels may be required for the transistors of the IC to operate with the same performance as during production testing.

Therefore, there is a need for providing a management system capable of optimizing performance, thermal characteristics and power consumption of ICs.

SUMMARY

The present invention provides a performance, thermal and power (PTP) management system associated with an integrated circuit. The PTP management system includes a performance circuit with adjustable configurations for simulating operations of the IC when receiving a supply voltage; a sensing module configured to measure a characteristic of the performance circuit; a memory for storing characterization data associated with the IC; and a PTP controller configured to set the performance circuit in a specific configuration according to the characterization data and adjust a level of the supply voltage according to the characteristic of the performance circuit.

The present invention also provides a method for managing performance, thermal and power of an integrated circuit. The method includes providing a performance circuit with adjustable configurations for simulating operations of the IC when receiving a supply voltage, providing characterization data associated with the IC, setting the performance circuit in a specific configuration according to the characterization data, and adjust a level of the supply voltage according to a characteristic of the performance circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Certain terms are used throughout the following descriptions and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . ." Also, the term "couple" or "couples" is intended to mean either an indirect or direct electrical connection. Thus, if a first device couples to a second device, that connection may be through a direct electrical connection, or through an indirect electrical connection via other devices and connections.

Figure 1:
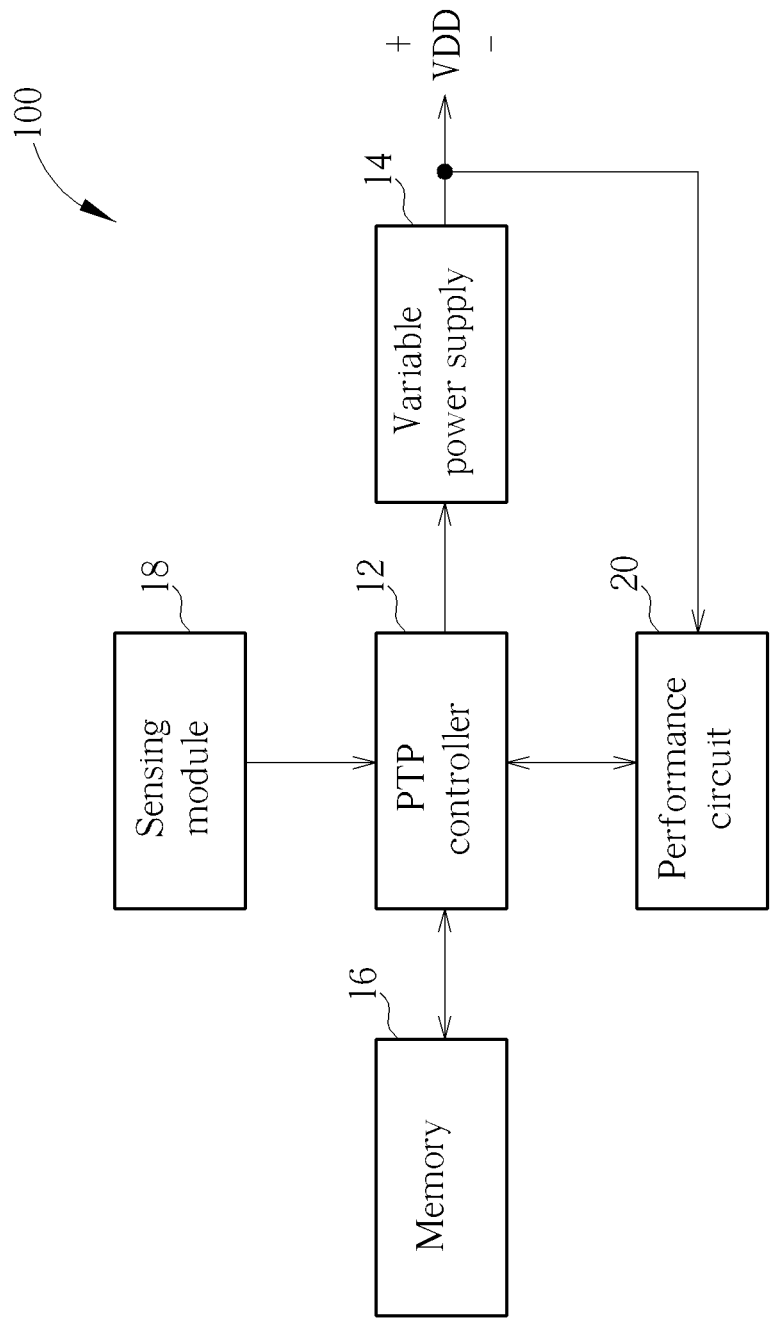
FIG. 1 illustrates a functional diagram of a PTP management system in accordance with an aspect of the present invention.

FIG. 1 illustrates a functional diagram of a performance, thermal and power (PTP) management system 100 in accordance with an aspect of the present invention. The PTP system 100 may be implemented for a power management integrated circuit (PMIC), having one or more voltage potentials which may be adaptively scaled within the PMIC. Alternatively, the PTP system 100 may be implemented for one or more separate PMICs. In such implementations, the PTP system 100 may conserve power by providing an amount of voltage that is a minimum sufficient voltage for a given application use. As used herein, the term "application use" is used to describe a use of the PMIC for its intended function, such as in a consumer electronic device.

The PTP system 100 includes a PTP controller 12, a variable power supply 14, a memory 16, a sensing module 18 and a performance circuit 20. The PTP controller 12 is configured to control the operations of the variable power supply 14, the sensing module 16 and the performance circuit 20. The variable power supply 14 may be implemented to provide one or more voltage potentials (hereinafter referred to as $V_{DD}$) to one of more PMICs. In the embodiment depicted in FIG. 1, the variable power supply 14 is demonstrated as having a single output voltage $V_{DD}$. However, it is to be understood that the variable power supply 14 may be configured to have multiple different outputs. In addition, the example of FIG. 1 is not limited to a single variable power supply 14, but may include a plurality of power supplies, each separately configurable by the PTP controller 12.

In the embodiments of the present invention, the memory 16 may be an eFuse, a flash memory, or any of a variety of memory types. The sensing module 18 may include one or multiple types of sensors, such as voltage sensor, temperature sensor, workload sensor or reliability sensor. The performance circuit 20 may include one or more PTP detector, each separately configurable by the PTP controller 12

Figure 2:
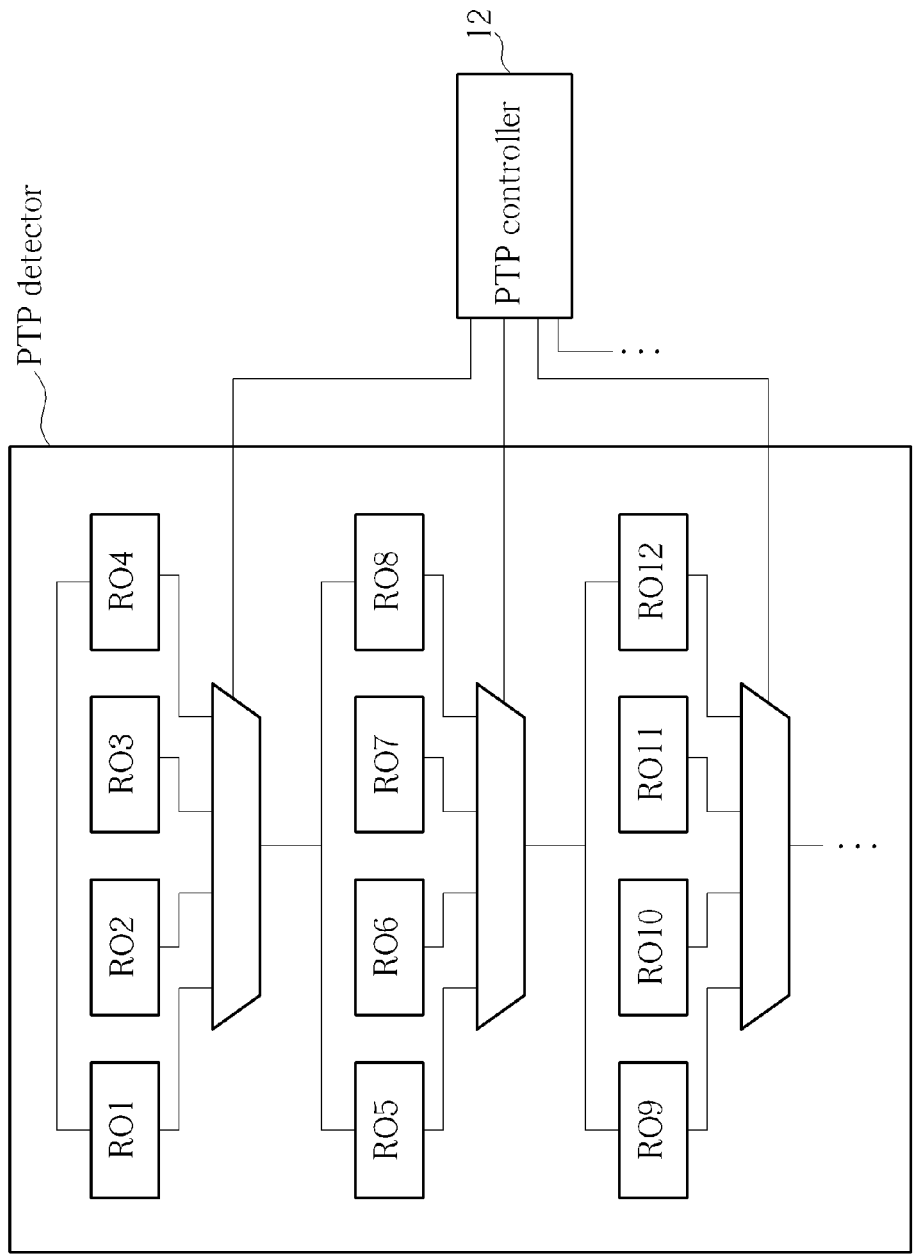
FIG. 2 illustrates a diagram of a configurable PTP detector in the performance circuit in accordance with an aspect of the present invention.

FIG. 2 illustrates a diagram of a configurable PTP detector in the performance circuit 20 in accordance with an aspect of the present invention. Each PTP detector may include a plurality ring oscillators RO1-RO12 made of logic devices, such as NAND gates, NOR gates, invertors and any combination thereof. The number and configuration of the ring oscillators demonstrated in FIG. 2 are merely for illustrative purpose, and do not limit the scope of the present invention. Each ring oscillator may oscillate between states at a frequency that can be variable based on an applied voltage, which may be the voltage $V_{DD}$ or another voltage supplied from the variable power supply 14 (not shown in FIG. 2) or another power supply. The PTP controller 12 may set the configuration of each PTP detector so as to vary its characteristics, such as NBTI or HCI sensibility. Each PTP detector may be implemented to set the voltage $V_{DD}$ for a target performance, such as frequency, of an application use of the PMIC that may be specifically associated with the switching of NMOS devices, PMOS devices or any combination thereof.

Using a dynamic voltage and frequency scaling (DVFS) scheme, the PTP management system 100 of the present invention is configured to achieve optimized thermal and power performance of the PMIC by performing DVFS calibration, temperature compensation adjustment, aging calibration, and DC offset calibration. The purpose of DVFS calibration is to compensate chip-to-chip process variations of different PMICs and determine an optimized initial voltage $V_O$ for operating a given PMIC at room temperature. The purpose of temperature compensation adjustment is to prevent the given PMIC from deviating from its target performance due to temperature variation and determine a corresponding compensation voltage $\Delta V_{TEMP}$. The purpose of DC offset calibration is to determine a compensation voltage $\Delta V_{DC}$ for compensating the voltage drop caused by inaccuracy or resistance of the given PMIC. The purpose of aging calibration is to determine a compensation voltage $\Delta V_{AGE}$ for compensating the performance degradation of the given PMIC due to aging effect. Thus, the voltage $V_{DD}$ may be adaptively set to $(V_O + \Delta V_{TEMP} + \Delta V_{DC} + \Delta V_{AGE})$ for optimizing thermal and power performance of the given PMIC. The operation of the PTP management system 100 will be explained in greater detail in the following paragraphs.

Figure 3:
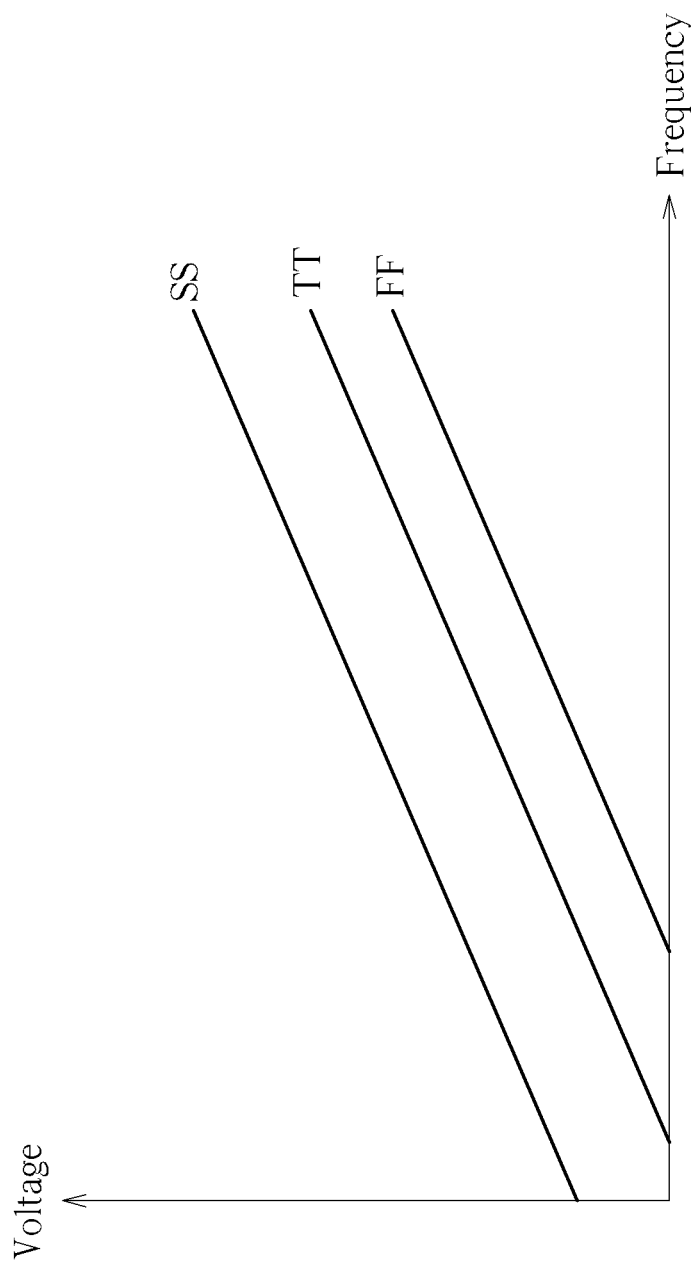
FIG. 3 is a diagram illustrating the operation of the PTP management system when performing DVFS calibration in accordance with an aspect of the present invention.

FIG. 3 is a diagram illustrating the operation of the PTP management system 100 when performing DVFS calibration in accordance with an aspect of the present invention. One or more characteristic numbers may be obtained for a given PMIC during production testing. For example, the relationship between the minimum voltage $V_{MIN}$ (i.e. a minimum sufficient voltage for a given application use of the PMIC) and the operating frequency may be characterized by testing a plurality of substantially similar PMICs at room temperature. The characterization data (the voltage-frequency relationship of the PMIC) may then be stored in the memory 16.

In the embodiment depicted in FIG. 3, the horizontal axis represents the operating frequency, and the vertical axis represents the operating voltage. Curves SS, TT and FF represent the minimum voltage for operating devices made of slow silicon, typical silicon and fast silicon at a given frequency at room temperature, respectively. At a given voltage, the maximum operating frequency is limited by the device made of slow silicon with the lowest performance. At a given operating frequency, the maximum power is consumed by the device made of fast silicon. A characteristic number set may be obtained by performing linear approximation on the characterization data SS, TT and FF and stored in the memory 16. Therefore, the PTP controller 12 may retrieve a characteristic number corresponding to an operational frequency requested by the software of the given PMIC, thereby setting the initial voltage $V_O$ with a minimum margin. In addition, different initial voltages for different application uses of the given PMIC may be set concurrently or at different times. As such, the PTP controller 12 can retrieve the necessary one or more characteristic numbers from characterization data stored in the memory 16 every time the PTP controller 12 sets the initial voltage $V_O$, thereby minimizing the power consumption of the given PMIC for the given application use regardless of process variations.

Figure 4:
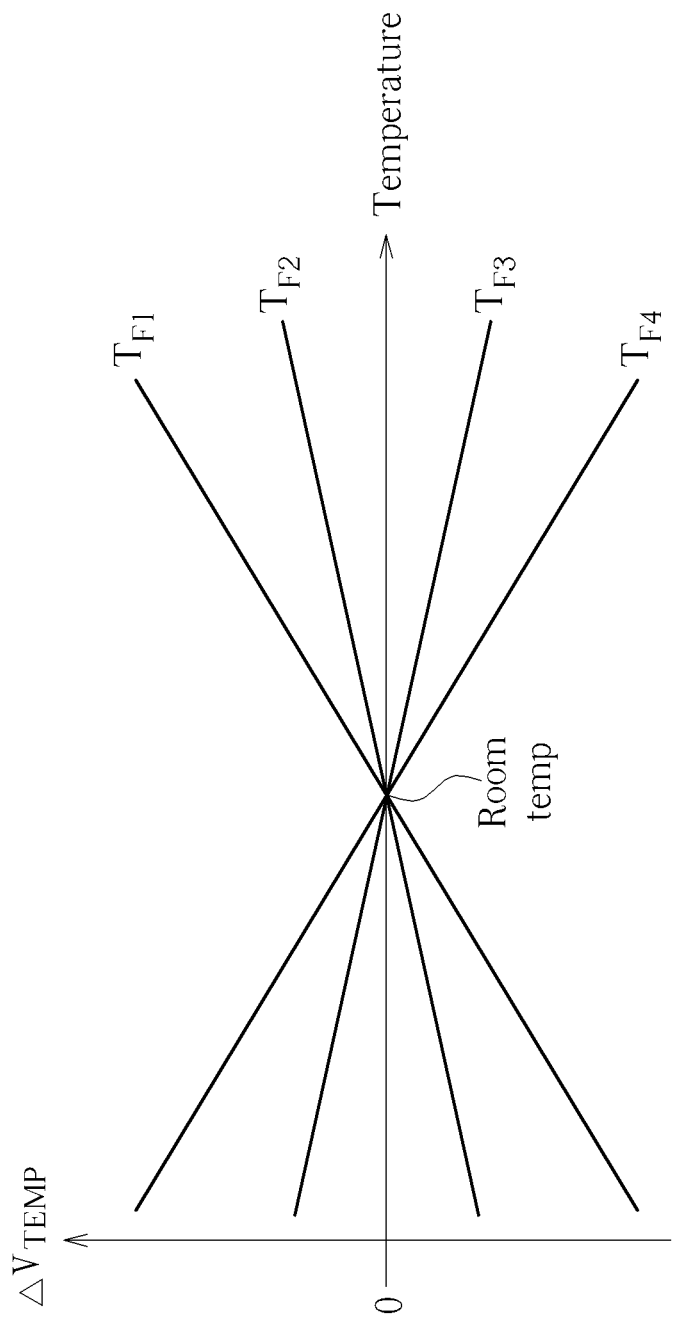
FIG. 4 is a diagram illustrating the operation of the PTP management system when performing temperature compensation adjustment in accordance with an aspect of the present invention.

FIG. 4 is a diagram illustrating the operation of the PTP management system 100 when performing temperature compensation adjustment in accordance with an aspect of the present invention. One or more characteristic numbers may be obtained for a given PMIC during production testing. For example, the relationship between the minimum voltage $V_{MIN}$ (i.e. a minimum sufficient voltage for a given application use of the PMIC) and the operating frequency may be characterized by testing a plurality of substantially similar PMICs at a plurality of temperatures. The characterization data (the voltage-frequency-temperature relationship of the PMIC) may then be stored in the memory 16.

In the embodiment depicted in FIG. 4, the horizontal axis represents the temperature measured by the thermal sensor in the sensing module 18, and the vertical axis represents the amount of voltage adjustment $\Delta V_{TEMP}$. Curves $T_{F1} \sim T_{F4}$ represent the amount of voltage adjustment at a given temperature when operating at frequencies F1~F4, respectively, wherein F1>F2>F3>F4. Therefore, the PTP controller 12 may retrieve a characteristic number $\Delta V_{TEMP}$ corresponding to the measured temperature and an operational frequency requested by the software of the given PMIC, thereby adjusting the voltage $V_{DD}$ from $V_O$ by an amount of $\Delta V_{TEMP}$ for compensating environmental variations.

Figure 5:
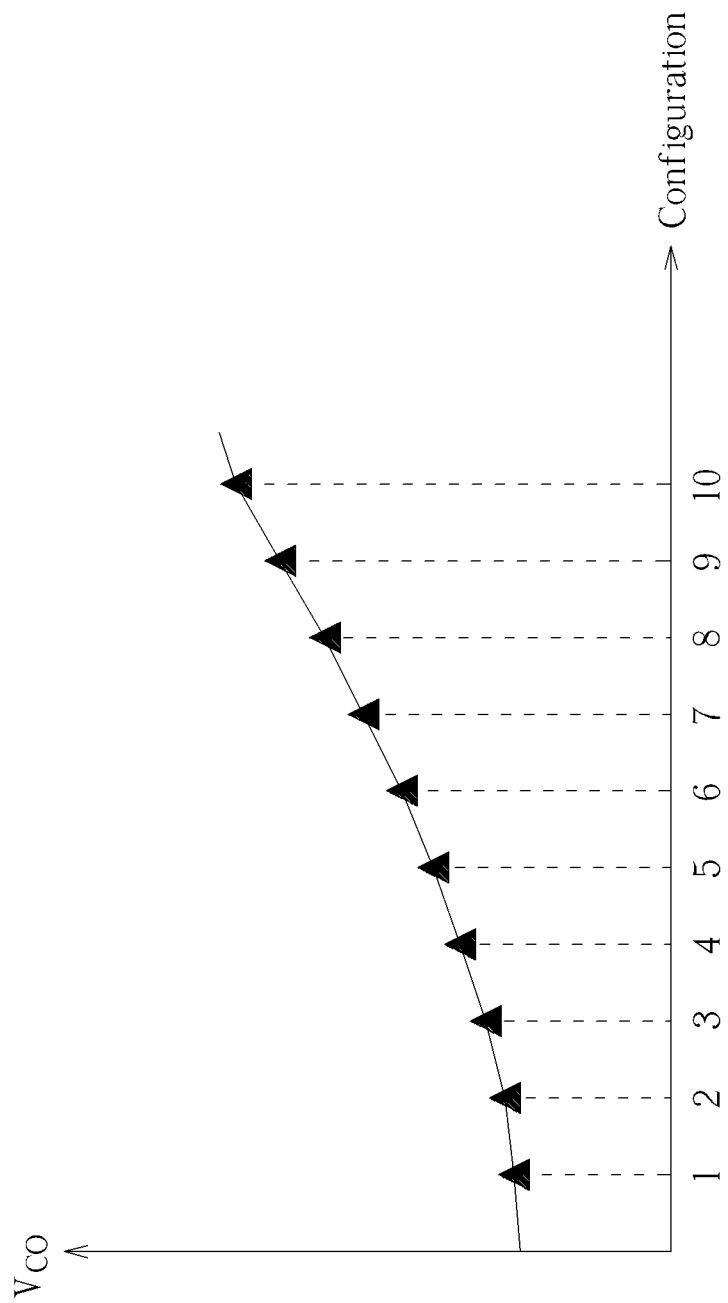
FIG. 5 is a diagram illustrating the operation of the PTP management system when performing DC offset calibration in accordance with an aspect of the present invention.

FIG. 5 is a diagram illustrating the operation of the PTP management system 100 when performing DC offset calibration in accordance with an aspect of the present invention. One or more characteristic numbers may be obtained by measuring the crossover voltages of the performance circuit 20 set in various configurations. When a device operates at its crossover voltage, the operational frequency is least sensitive to the temperature. The characterization data (the crossover voltages of the performance circuit 20 in different configurations) may then be stored in the memory 16.

In the embodiment depicted in FIG. 5, the horizontal axis represents various configurations of the performance circuit 20 having different NBTI-sensitivity and HCI-sensitivity. The vertical axis represents the crossover voltage $V_{CO}$ at which the operational frequency is least sensitive to the temperature. When detecting a DC offset in the given PMIC, the performance circuit 20 is set to a specific configuration whose crossover voltage $V_{CO}$ best matches the PMIC voltage. The voltage supplied to the performance circuit 20 of the specific configuration is then adjusted for achieving the frequency target, thereby acquiring the DC offset voltage $\Delta V_{DC}$. Therefore, the PTP controller 12 may adjust the voltage $V_{DD}$ from $V_O$ by an amount of $\Delta V_{DC}$ which is least relevant to temperate, thereby accurately compensating the voltage drop caused by inaccuracy or resistance of the given PMIC.

Figure 6:
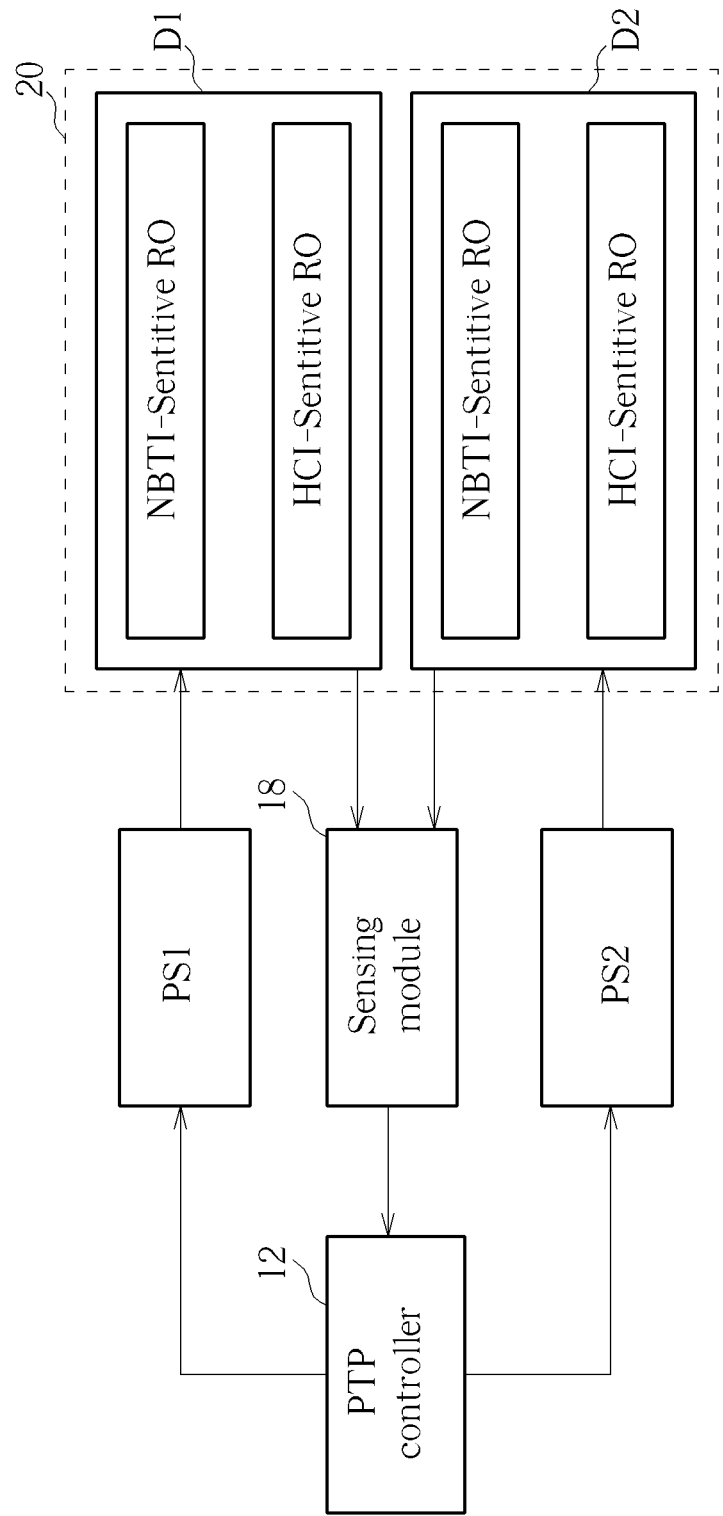
FIG. 6 illustrates a diagram of the performance circuit for performing aging calibration in accordance with an aspect of the present invention.

FIG. 6 illustrates a diagram of the performance circuit 20 for performing aging calibration in accordance with an aspect of the present invention. In this embodiment, the performance circuit 20 includes two PTP detectors D1 and D2 may be made up of NBTI-sensitive and/or HCI-sensitive devices. Though identical in circuit structure, the PTP detectors D1 and D2 are powered by power supplies PS1 and PS2, respectively. In an operating life test (OLT) which simulates a long-period of work environment with accelerated temperature and voltage alterations in a short period of time, the non-aged PTP detector D1 is powered on by the power supply PS1 during the booting period and then powered off after the initialization is completed, while the aged PTP detector D2 is powered on by the power supply PS2 according to a system clock based on which the PMIC operates. In the embodiment depicted in FIG. 6, the PTP detectors D1 and D2 are demonstrated to have respective power supplies PS1 and PS2. However, it is to be understood that the PTP detectors D1 and D2 may also be supplied by the variable power supply 14 which is controlled by the PTP controller 12 according to different timing signals for providing respective power-on periods.

In the embodiment depicted in FIG. 6, the sensing module may measure the non-aged performance of the PTP detectors D1 and the aged performance of the PTP detectors D2. The aging compensation voltage $V_{AGE}$ may be calculated based on the difference between the non-aged performance and the aged performance. Therefore, the PTP controller 12 may adjust the voltage $V_{DD}$ from $V_O$ by an amount of $\Delta V_{AGE}$, thereby compensating for the aging effects of the semiconductor material of the PMIC.

The PTP management system 100 of the present invention is configured to perform DVFS calibration, temperature compensation adjustment, aging calibration, and DC offset calibration. The voltage $V_{DD}$ supplied to a PMIC may be set to an initial voltage which takes chip-to-chip process variations into account and then dynamically adjusted according to temperature variations, DC offset and/or aging effects. Therefore, the present invention may achieve optimized thermal and power performance of the PMIC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A performance, thermal and power (PTP) management system associated with an integrated circuit (IC), comprising:
   a performance circuit with adjustable configurations for simulating operations of the IC when receiving a supply voltage;
   a sensing module configured to measure a characteristic of the performance circuit, the characteristic includes a non-aged voltage and an aged voltage of the performance circuit;
   a memory for storing characterization data associated with the IC, the characterization data includes a voltage difference between the non-aged voltage and the aged voltage of the performance circuit; and
   a PTP controller configured to:
     set the performance circuit in a specific configuration according to the characterization data; and
     adjust a level of the supply voltage according to the characteristic of the performance circuit.

2. The PTP management system of claim 1, wherein:
   the characterization data further includes a voltage-frequency relationship of the IC when operating at a predetermined temperature for a given application use; and
   the PTP controller is further configured to calculate a specific voltage for operating the IC at a specific frequency and the predetermined room temperature according to the voltage-frequency relationship and adjust the level of the supply voltage according to the specific voltage.

3. The PTP management system of claim 2, wherein:
   the characterization data further includes a voltage-frequency-temperature relationship of the IC when operating at a plurality of predetermined temperatures for the given application use;
   the sensing module is further configured to detect a temperature change of the IC; and
   the PTP controller is further configured to calculate a specific compensation voltage associated with the temperature change at the specific frequency according to the voltage-frequency-temperature relationship and adjust the level of the supply voltage according to the specific voltage and the specific compensation voltage.

4. The PTP management system of claim 3, wherein:
   the characterization data further includes crossover voltages of the performance circuit in a plurality of configurations;
   the sensing module is further configured to measure an IC voltage; and
   the PTP controller is further configured to set the performance circuit in a configuration corresponding to a crossover voltage commensurate with the IC voltage.

5. The PTP management system of claim 4, wherein:
   the performance circuit includes a first PTP detector and a second PTP detector having an identical circuitry;
   the PTP controller is further configured to:
     power on the first PTP detector during a booting sequence of the IC and power off the first PTP detector after the booting sequence of the IC ends; and
     power on the second PTP detector according to a system clock based on which the IC operates; and
   the sensing module is further configured to measure the non-aged voltage from the first PTP detector and measure the aged voltage from the second PTP detector.

6. The PTP management system of claim 1, further comprising setting the level of the supply voltage to a predetermined value for a given application use, wherein:

the characterization data further includes a voltage-frequency-temperature relationship of the IC when operating at a plurality of predetermined temperatures for the given application use;

the sensing module is further configured to detect a temperature change of the IC; and the PTP controller is further configured to calculate a specific compensation voltage associated with the temperature change at a specific frequency according to the voltage-frequency-temperature relationship and adjust the level of the supply voltage according to the specific compensation voltage.

7. The PTP management system of claim 6, wherein:

the characterization data further includes crossover voltages of the performance circuit in a plurality of configurations;

the sensing module is further configured to measure an IC voltage; and the PTP controller is further configured to set the performance circuit in a configuration corresponding to a crossover voltage commensurate with the IC voltage.

8. The PTP management system of claim 7, wherein:

the performance circuit includes a first PTP detector and a second PTP detector having an identical circuitry;

the PTP controller is further configured to:

power on the first PTP detector during a booting sequence of the IC and power off the first PTP detector after the booting sequence of the IC ends; and power on the second PTP detector according to a system clock based on which the IC operates; and the sensing module is further configured to measure the non-aged voltage of the first PTP detector and measure the aged voltage of the second PTP detector.

9. The PTP management system of claim 1, further comprising setting the level of the supply voltage to a predetermined value for a given application use, wherein:

the characterization data is further associated with the performance circuit and includes crossover voltages of the performance circuit in a plurality of configurations;

the sensing module is further configured to measure an IC voltage; and the PTP controller is further configured to set the performance circuit in a configuration corresponding to a crossover voltage commensurate with the IC voltage.

10. The PTP management system of claim 9, wherein:

the performance circuit includes a first PTP detector and a second PTP detector having an identical circuitry;

the PTP controller is further configured to:

power on the first PTP detector during a booting sequence of the IC and power off the first PTP detector after the booting sequence of the IC ends; and power on the second PTP detector according to a system clock based on which the IC operates; and the sensing module is further configured to measure the non-aged voltage of the first PTP detector and measure the aged voltage of the second PTP detector.

11. The PTP management system of claim 1, wherein:

the performance circuit includes a first PTP detector and a second PTP detector having an identical circuitry;

the PTP controller is further configured to:

power on the first PTP detector during a booting sequence of the IC and power off the first PTP detector after the booting sequence of the IC ends; and power on the second PTP detector according to a system clock based on which the IC operates; and the sensing module is further configured to measure the non-aged voltage of the first PTP detector and measure the aged voltage of the second PTP detector.

12. A method for performance, thermal and power (PTP) management system associated with an integrated circuit (IC), comprising:

providing a performance circuit with adjustable configurations for simulating operations of the IC when receiving a supply voltage;

providing characterization data associated with the IC, the characterization data includes a voltage difference between a non-aged voltage and an aged voltage of the performance circuit;

setting the performance circuit in a specific configuration according to the characterization data; and adjusting a level of the supply voltage according to a characteristic of the performance circuit, the characteristic includes the non-aged voltage and the aged voltage of the performance circuit.

13. The method of claim 12, further comprising:

providing the characterization data associated with the IC by acquiring a voltage-frequency relationship of the IC when operating at a predetermined temperature for a given application use;

calculating a specific voltage for operating the IC at a specific frequency and the predetermined room temperature according to the voltage-frequency relationship; and adjusting the level of the supply voltage according to the specific voltage.

14. The method of claim 13, further comprising:

providing the characterization data associated with the IC by acquiring a voltage-frequency-temperature relationship of the IC when operating at a plurality of predetermined temperatures for the given application use;

detecting a temperature change of the IC;

calculating a specific compensation voltage associated with the temperature change at the specific frequency according to the voltage-frequency-temperature relationship; and adjusting the level of the supply voltage according to the specific voltage and the specific compensation voltage.

15. The method of claim 14, further comprising:

measuring crossover voltages of the performance circuit in a plurality of configurations and an IC voltage; and setting the performance circuit in a configuration corresponding to a crossover voltage commensurate with the IC voltage.

16. The method of claim 15, further comprising:

powering on a first PTP detector of the performance circuit during a booting sequence of the IC and powering off the first PTP detector after the booting sequence of the IC ends;

powering on a second PTP detector of the performance circuit according to a system clock based on which the IC operates;

measuring the non-aged voltage of the first PTP detector and the aged voltage of the second PTP detector;

calculating the voltage difference based on a difference between the non-aged voltage and the aged voltage; and setting the performance circuit in a configuration commensurate with the voltage difference.

17. The method of claim 12, further comprising:

setting the level of the supply voltage to a predetermined value for a given application use;

providing the characterization data associated with the IC by acquiring a voltage-frequency-temperature relationship of the IC when operating at a plurality of predetermined temperatures for the given application use;

detecting a temperature change of the IC;

calculating a specific compensation voltage associated with the temperature change at the specific frequency according to the voltage-frequency-temperature relationship; and adjusting the level of the supply voltage according to the specific compensation voltage.

18. The method of claim 17, further comprising:

measuring crossover voltages of the performance circuit in a plurality of configurations and an IC voltage; and setting the performance circuit in a configuration corresponding to a crossover voltage commensurate with the IC voltage.

19. The method of claim 18, further comprising:

powering on a first PTP detector of the performance circuit during a booting sequence of the IC and powering off the first PTP detector after the booting sequence of the IC ends;

powering on a second PTP detector of the performance circuit according to a system clock based on which the IC operates;

measuring the non-aged voltage of the first PTP detector and the aged voltage of the second PTP detector;

calculating the voltage difference based on a difference between the non-aged voltage and the aged voltage; and setting the performance circuit in a configuration commensurate with the voltage difference.

20. The method of claim 12, further comprising:

setting the level of the supply voltage to a predetermined value for a given application use;

measuring crossover voltages of the performance circuit in a plurality of configurations and an IC voltage; and setting the performance circuit in a configuration corresponding to a crossover voltage commensurate with the IC voltage.

21. The method of claim 20, further comprising:

powering on a first PTP detector of the performance circuit during a booting sequence of the IC and powering off the first PTP detector after the booting sequence of the IC ends;

powering on a second PTP detector of the performance circuit according to a system clock based on which the IC operates;

measuring the non-aged voltage of the first PTP detector and the aged voltage of the second PTP detector;

calculating the voltage difference based on a difference between the non-aged voltage and the aged voltage; and setting the performance circuit in a configuration commensurate with the voltage difference.

22. The method of claim 12, further comprising:

setting the level of the supply voltage to a predetermined value for a given application use;

powering on a first PTP detector of the performance circuit during a booting sequence of the IC and powering off the first PTP detector after the booting sequence of the IC ends;

powering on a second PTP detector of the performance circuit according to a system clock based on which the IC operates;

measuring the non-aged voltage of the first PTP detector and the aged voltage of the second PTP detector;

calculating the voltage difference based on a difference between the non-aged voltage and the aged voltage; and setting the performance circuit in a configuration commensurate with the voltage difference.

\* \* \* \* \*